(12) United States Patent
Wu (10) Patent No.: US 12,125,837 B1
(45) Date of Patent: Oct. 22, 2024

(54) INTEGRATED LIGHT EMITTING DIODE(LED) PACKAGE STRUCTURE LIGHT SOURCE

(71) Applicant: GUANGXI XINYI PHOYOELECTRIC TECHNOLOGY CO., LTD, Guangxi (CN)

(72) Inventor: Xianquan Wu, Guangxi (CN)

(73) Assignee: GUANGXI XINYI PHOYOELECTRIC TECHNOLOGY CO., LTD, Wuzhou (CN)

( * ) Notice: Subject to any disclaimer, the term of this patent is extended or adjusted under 35 U.S.C. 154(b) by 0 days.

(21) Appl. No.: 18/420,882

(22) Filed: Jan. 24, 2024

(51) Int. Cl.
*H01L 25/16* (2023.01)
*H01L 33/62* (2010.01)

(52) U.S. Cl.
CPC ............ *H01L 25/167* (2013.01); *H01L 33/62* (2013.01)

(58) Field of Classification Search
CPC ..... H01L 25/167; H01L 33/62; H01L 33/486; H01L 33/36; H01L 33/387; H01L 23/4824; H01L 23/12; H05B 45/00
See application file for complete search history.

(56) References Cited

FOREIGN PATENT DOCUMENTS

CN 212461689 U * 2/2021

* cited by examiner

*Primary Examiner* — Antonio B Crite (57) ABSTRACT

An integrated LED package structure light source includes: a plurality of LED package structure bodies. The plurality of LED package structure bodies each include a BT plate, a positive-electrode terminal, a negative-electrode terminal, LED light-emitting chips, a control integrated circuit (IC), and a package colloid. The BT plate is made of a light-transmissive BT material. The BT plate and an LED chip packaged on one side of the BT plate allow light of the LED chip to be transmitted through the periphery and top end of the package colloid and the back side of the BT plate, thereby improving the light-emitting dead angle, achieving comprehensive light-emitting, reducing the production cost, improving the device practicability, facilitating port distribution rules, and achieving the structure and connection simplicity. Moreover, LEDs can be directly and quickly connected through connection wires, and the external control IC is not required anymore, reducing the manufacturing cost.

10 Claims, 6 Drawing Sheets

INTEGRATED LIGHT EMITTING DIODE(LED) PACKAGE STRUCTURE LIGHT SOURCE

TECHNICAL FIELD

The present disclosure belongs to the technical field of light emitting diode (LED) light sources, and in particular, relates to an integrated LED package structure light source.

BACKGROUND

In light emitting diode (LED) lighting, a semiconductor solid light-emitting device is used. The device takes a solid semiconductor chip as the luminescent material, excess energy is released through the recombination of carriers in a semiconductor to cause photon emission, and red light, yellow light, blue light, and green light are directly emitted. On this basis, light of any color can be emitted by adding phosphor by means of the principle of three primary colors. The semiconductor chip is a P-N junction, which can directly convert electricity into light. The semiconductor chip is an LED chip including a semiconductor. One end of the LED chip is attached to a lead frame (substrate) as a negative electrode, and the other end is connected to the positive electrode of a power supply. Then the entire LED chip is encapsulated with epoxy resin to form an LED packaging structure.

There are still the following deficiencies in the prior art:

The front and back sides of the lead frame of the existing LED packaging structure are opaque. The LED chip (semiconductor chip) packaged on one side of the lead frame can only emit light on this side of the lead frame. Light cannot be transmitted from the other side of the lead frame due to the obstruction of the lead frame. The existing solution is to encapsulate LED chips on both sides of the lead frame to achieve full illumination. However, this solution requires twice the number of LED chips to be packaged, which increases the cost. Moreover, the LED colored lamps in the prior art all need to be soldered on a PCB first, and the PCB is provided with complex wiring inside, such that the structure of the PCB is relatively complex and the manufacturing cost is relatively high.

SUMMARY

The present disclosure provides an integrated light emitting diode (LED) package structure light source, and aims to solve the problems that the front and back sides of the lead frame of the existing LED package structure are opaque, and the LED chip (semiconductor chip) packaged on one side of the lead frame can only emit light on this side of the lead frame, but not on the other side of the lead frame due to the obstruction of the lead frame. Therefore, the existing solution is to package LED chips on both sides of the lead frame to form comprehensive light emission. However, this solution requires twice the number of LED chips to be packaged, which increases the cost. Moreover, the LED colored lamps in the prior art all need to be soldered on a PCB first, and the PCB is provided with complex wiring inside, such that the structure of the PCB is relatively complex and the manufacturing cost is relatively high.

The present disclosure is achieved like this: an integrated LED package structure light source, including: a plurality of LED package structure bodies, where the plurality of LED package structure bodies each include a BT plate, a positive-electrode terminal, a negative-electrode terminal, LED light-emitting chips, a control integrated circuit (IC), and a package colloid; the BT plate is made of a light-transmissive material; a first GND port, a first signal input DI port, and a first VDD port are provided on one side of the LED light-emitting chip from top to bottom; a second GND port, a second signal output DO port, and a second VDD port are provided on the other side of the LED light-emitting chip from top to bottom; the first GND port is a negative-electrode input port; the second GND port is a negative-electrode output port; the first VDD port is a positive-electrode input port; the second VDD port is a positive-electrode output port; the second GND port of one LED light-emitting chip corresponds to the first GND port of the other LED light-emitting chip; the second signal output DO port of one LED light-emitting chip corresponds to the first signal input DI port of the other LED light-emitting chip; and the second VDD port of one LED light-emitting chip corresponds to the first VDD port of the other LED light-emitting chip.

Preferably, the positive-electrode terminal and the negative-electrode terminal are arranged in a pair and are not in contact with each other; the LED light-emitting chip is electrically connected to the positive-electrode terminal and the negative-electrode terminal; the package colloid is disposed at a top end of the BT plate; and the LED light-emitting chip is fixedly packaged inside the package colloid.

Preferably, the BT plate is made of glass, fiberglass cloth, a resin adhesive, a PC material or BT; the BT plate is made by a die injection molding technology of BT board+lead frame+sealant; and the BT plate and the package colloid are completely bonded to form a complete LED package structure.

Preferably, the positive-electrode terminal and the negative-electrode terminal are respectively arranged on two sides of the top end of the BT plate, leads are connected to two ends of the LED light-emitting chip, the two leads are respectively bonded to the positive-electrode terminal and the negative-electrode terminal, and the leads are fixedly packaged inside the package colloid.

Preferably, the first GND port is connected to the negative-electrode terminal, and the second VDD port is connected to the negative-electrode terminal.

Preferably, a positive-electrode pad and a negative-electrode pad are provided at a bottom end of the BT plate, the positive-electrode pad is arranged opposite to the positive-electrode terminal, the positive-electrode pad is electrically conducted with the positive-electrode terminal, the negative-electrode pad is arranged opposite to the negative-electrode terminal, the negative-electrode pad is electrically conducted with the negative-electrode terminal, arc-shaped notches are respectively formed in outer sides of the positive-electrode terminal and the negative-electrode terminal, copper is provided on side walls of the arc-shaped notches, the positive-electrode terminal is electrically conducted with the positive-electrode pad through the copper, and the negative-electrode terminal is electrically conducted with the negative-electrode pad through the copper.

Preferably, a positive-electrode conductive connection region and a negative-electrode conductive connection region are provided at the top end of the BT plate, there is a gap between the negative-electrode conductive connection region and the positive-electrode conductive connection region, the LED light-emitting chip is disposed on the negative-electrode conductive connection region, the LED light-emitting chip is bonded to the positive-electrode conductive connection region through the leads, and the LED light-emitting chip is fixedly packaged with the positive-electrode conductive connection region and the negative-electrode conductive connection region through the package colloid.

Preferably, the second GND port of one LED light-emitting chip is directly and electrically connected to the first GND port of the other LED light-emitting chip through a connection lead; the second signal output DO port of one LED light-emitting chip is directly and electrically connected to the first signal input DI port of the other LED light-emitting chip through a connection lead; and the second VDD port of one LED light-emitting chip is directly and electrically connected to the first VDD port of the other LED light-emitting chip through a connection lead.

Preferably, a controller is provided on a side of each of the plurality of LED package structure bodies, the controller is provided with a negative-electrode output terminal and a signal output terminal, the negative-electrode output terminal is directly and electrically connected to the first GND port through a connection lead, and the signal output terminal is directly and electrically connected to the first signal input DI port through a connection lead.

Preferably, a metal conductive layer is provided on the BT plate, a drive control IC is provided on the metal conductive layer, and the LED light-emitting chip is electrically connected to the drive control IC and the metal conductive layer.

Compared with the prior art, embodiments of the present disclosure mainly have the following beneficial effects:

The BT plate made of the light-transmissive material and the LED chip packaged on one side of the BT plate allow light of the LED chip to be transmitted through the periphery and top end of the package colloid and the back side of the BT plate, thereby improving the light-emitting dead angle, achieving comprehensive light-emitting, reducing the production cost, improving the device practicability, facilitating regular port distribution, and achieving the structure and connection simplicity. Moreover, LEDs can be directly and quickly connected through connection wires, and the external control IC is not required anymore, thereby implementing the connection through a self-controlled flash method of the LED light source, and reducing the manufacturing cost.

Reference Numerals: 1. BT plate; 2. Positive-electrode terminal; 21. Positive-electrode pad; 22. Positive-electrode conductive connection region; 3. Negative-electrode terminal; 31. Negative-electrode pad; 32. Negative-electrode conductive connection region; 4. LED light-emitting chip; 5. Lead; 6. Package colloid; 7. Arc-shaped notch; 8. First GND port; 9. First signal input DI port; 10. First VDD port; 11. Second GND port; 12. Second signal output DO port; 13. Second VDD port; 14. Controller; 15. Negative-electrode output terminal; 16. Signal output terminal; 17. Metal conductive layer; 18. Drive control IC; 19. LED package structure light source; and 20. LED package structure body.

DETAILED DESCRIPTION OF THE EMBODIMENTS

Unless otherwise defined, all technical and scientific terms used in the present disclosure have the same meanings as commonly understood by those skilled in the technical field of the present disclosure. The terms used in the specification of the present disclosure are merely intended to describe the specific embodiments, rather than limit the present disclosure. The terms "includes" and "has" in the specification, claims, and accompanying drawings of the present disclosure and any variations thereof are intended to encompass without excluding other content. The terms "first", "second", and the like in the specification and claims or the accompanying drawings of the present disclosure are intended to distinguish different objects, rather than describe a specific order or a primary/secondary relationship.

The term "embodiment" mentioned herein means that a specific feature, structure, or characteristic described in combination with the embodiment may be included in at least one embodiment of the present application. The phrase appearing in different parts of the specification does not necessarily refer to the same embodiment or an independent or alternative embodiment exclusive of other embodiments. It may be explicitly or implicitly appreciated by those skilled in the art that the embodiments described herein may be combined with another embodiment.

Figure 1:
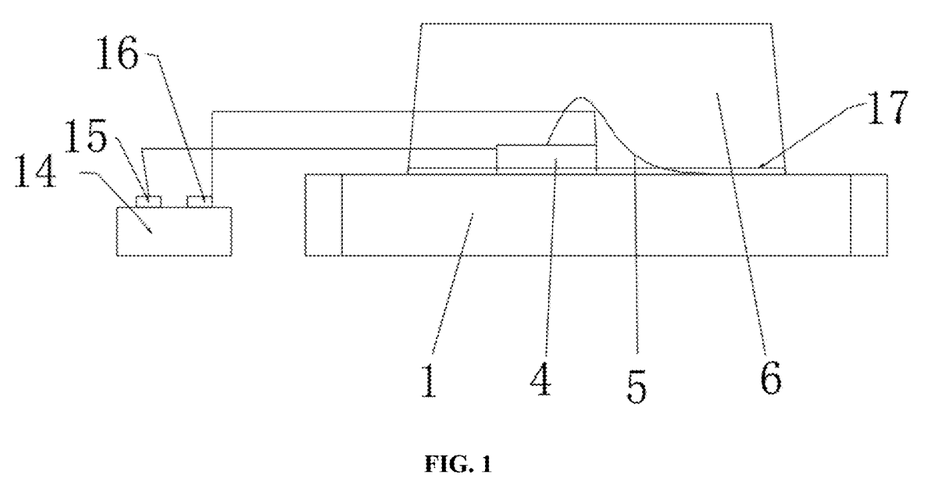
FIG. 1 is a schematic diagram of a front-view structure according to the present disclosure.
Figure 2:
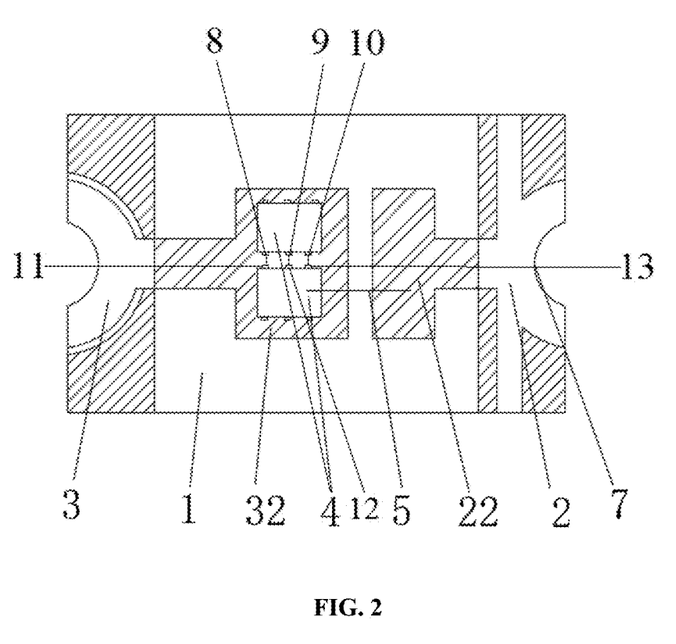
FIG. 2 is a schematic diagram of a top-view structure according to the present disclosure.
Figure 3:
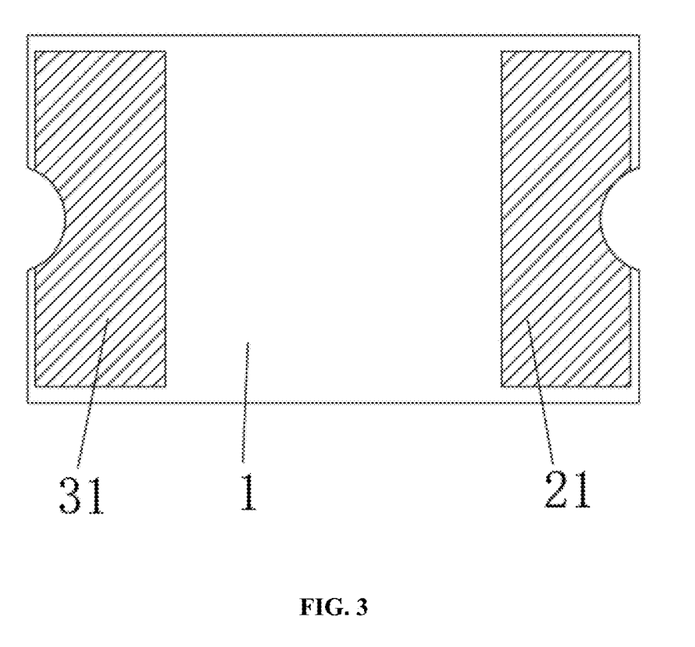
FIG. 3 is a schematic diagram of a bottom-view structure according to the present disclosure.
Figure 4:
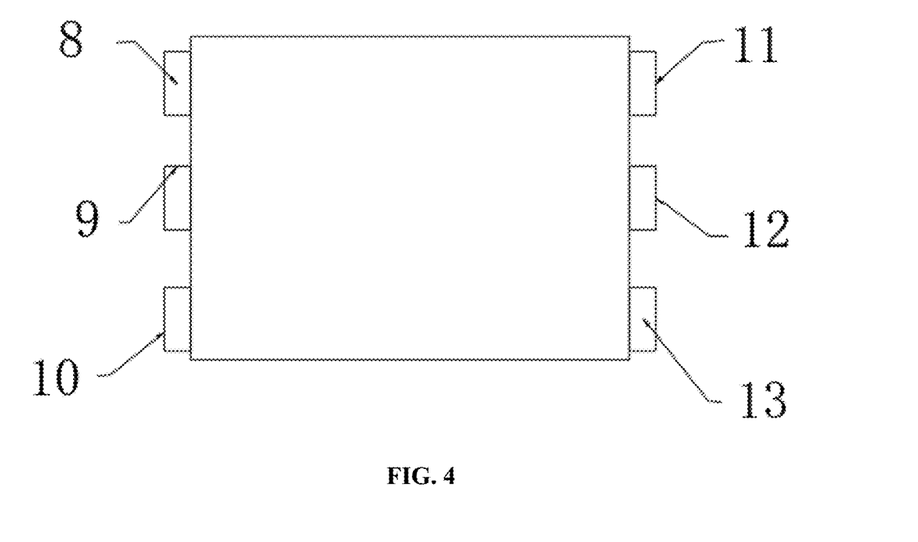
FIG. 4 is a schematic diagram of a structure at a first GND port according to the present disclosure.
Figure 5:
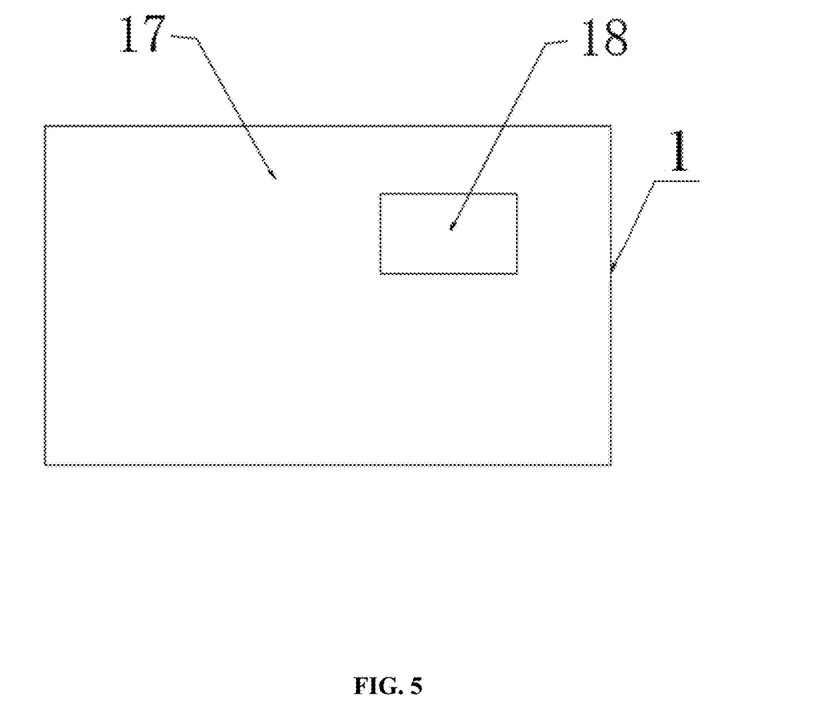
FIG. 5 is a schematic diagram of a structure at a drive control IC according to the present disclosure.
Figure 6:
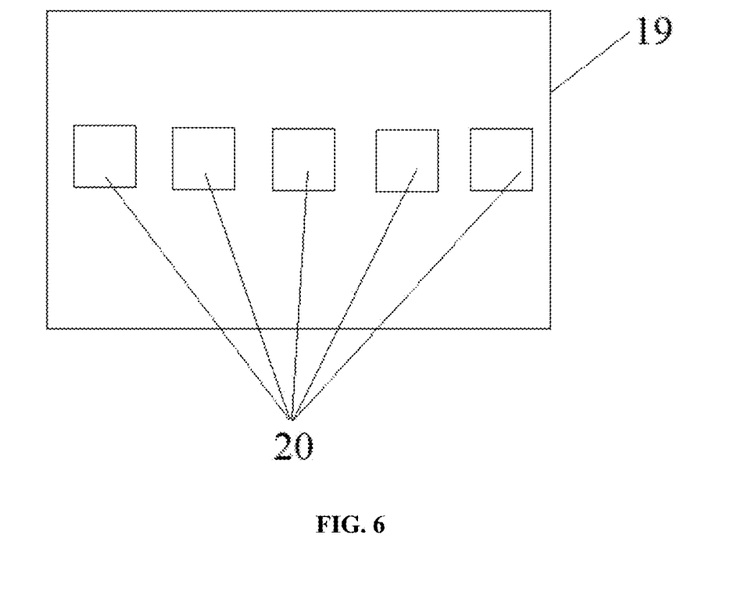
FIG. 6 is a schematic diagram of an overall structure according to the present disclosure.

Embodiments of the present disclosure provide an integrated light emitting diode (LED) package structure light source 19, as shown in FIG. 1 to FIG. 6, including: a plurality of LED package structure bodies 20, where the plurality of LED package structure bodies 20 each include a BT plate 1, a positive-electrode terminal 2, a negative-electrode terminal 3, LED light-emitting chips 4, a control integrated circuit (IC), and a package colloid 6; the BT plate 1 is made of a light-transmissive material; a first GND port 8, a first signal input DI port 9, and a first VDD port 10 are provided on one side of the LED light-emitting chip 4 from top to bottom; a second GND port 11, a second signal output DO port 12, and a second VDD port 13 are provided on the other side of the LED light-emitting chip 4 from top to bottom; the first GND port 8 is a negative-electrode input port; the second GND port 11 is a negative-electrode output port; the first VDD port 10 is a positive-electrode input port; the second VDD port 13 is a positive-electrode output port; the second GND port 11 of one LED light-emitting chip 4 corresponds to the first GND port 8 of the other LED light-emitting chip 4; the second signal output DO port 12 of one LED light-emitting chip 4 corresponds to the first signal input DI port 9 of the other LED light-emitting chip 4; and the second VDD port 13 of one LED light-emitting chip 4 corresponds to the first VDD port 10 of the other LED light-emitting chip 4.

It should be noted that since the front and back sides of the lead frame of the existing LED packaging structure are opaque, the LED chip (semiconductor chip) packaged on one side of the lead frame can only emit light on this side of the lead frame. As for the other side of the lead frame, light cannot be transmitted from this side due to the obstruction of the lead frame. Therefore, the existing solution is to encapsulate LED chips on both sides of the lead frame to achieve full illumination. However, this solution requires twice the number of LED chips to be packaged. To reduce the device cost, this solution employs the BT plate 1 and the package colloid 6 to make four side walls and the top and bottom surfaces of the LED light-emitting chip 4 transparent, such that the light can be transmitted without obstruction and the transmission surface is wide. The use of quick connection cables for connection further improves the connection efficiency and reduces the incidence of failures between connections. Since no PCB is for connection, the overall weight can also be reduced and installation is facilitated.

Specifically, in this embodiment, this solution mainly includes a BT plate 1, a positive-electrode terminal 2, a negative-electrode terminal 3, an LED light-emitting chip 4, and a package colloid 6. The positive-electrode terminal 2 and the negative-electrode terminal 3 provide electrical connections for the LED light-emitting chip 4. The BT plate 1 and the package colloid 6 are employed to fix the relative position of the LED light-emitting chip 4. The BT plate 1 made of the light-transmissive material and the package colloid 6 ensure that the light can be transmitted without obstruction.

In a further preferred embodiment of the present disclosure, the positive-electrode terminal 2 and the negative-electrode terminal 3 are arranged in a pair and are not in contact with each other; the LED light-emitting chip 4 is electrically connected to the positive-electrode terminal 2 and the negative-electrode terminal 3; the package colloid 6 is disposed at a top end of the BT plate 1; and the LED light-emitting chip 4 is fixedly packaged inside the package colloid 6.

In this embodiment, this solution employs the BT plate 1 and the package colloid 6 to make four side walls and the top and bottom surfaces of the LED light-emitting chip 4 transparent, such that the light can be transmitted without obstruction and the transmission surface is wide. The use of quick connection cables for connection further improves the connection efficiency and reduces the incidence of failures between connections.

In a further preferred embodiment of the present disclosure, as shown in FIG. 1 to FIG. 5, the BT plate 1 is made of glass, fiberglass cloth, a resin adhesive, a PC material or BT; the BT plate 1 is made by a die injection molding technology of BT board+lead frame+sealant; and the BT plate 1 and the package colloid 6 are completely bonded to form a complete LED package structure.

In this embodiment, the BT plate 1 made of glass, fiberglass cloth, a resin adhesive or a PC material ensures that the light can be transmitted without occlusion.

In a further preferred embodiment of the present disclosure, the positive-electrode terminal 2 and the negative-electrode terminal 3 are respectively arranged on two sides of the top end of the BT plate 1, leads 5 are connected to two ends of the LED light-emitting chip 4, the two leads 5 are respectively bonded to the positive-electrode terminal 2 and the negative-electrode terminal 3, and the leads 5 are fixedly packaged inside the package colloid 6.

In this embodiment, the positive-electrode terminal 2 and the negative-electrode terminal 3 are separately arranged to avoid short circuit in direct connection of lines. By arranging the leads 5, a power line of the LED light-emitting chip 4 is connected to ensure that the LED light-emitting chip 4 can emit light normally.

In a further preferred embodiment of the present disclosure, the first GND port 8 is connected to the negative-electrode terminal 3, and the second VDD port 13 is connected to the negative-electrode terminal 3.

In this embodiment, connection and power-on are facilitated.

In a further preferred embodiment of the present disclosure, a positive-electrode pad 21 and a negative-electrode pad 31 are provided at a bottom end of the BT plate 1, the positive-electrode pad 21 is arranged opposite to the positive-electrode terminal 2, the positive-electrode pad 21 is electrically conducted with the positive-electrode terminal 2, the negative-electrode pad 31 is arranged opposite to the negative-electrode terminal 3, the negative-electrode pad 31 is electrically conducted with the negative-electrode terminal 3, arc-shaped notches 7 are respectively formed in outer sides of the positive-electrode terminal 2 and the negative-electrode terminal 3, copper is provided on side walls of the arc-shaped notches 7, the positive-electrode terminal 2 is electrically conducted with the positive-electrode pad 21 through the copper, and the negative-electrode terminal 3 is electrically conducted with the negative-electrode pad 31 through the copper.

In this embodiment, by arranging the positive-electrode pad 21 and the negative-electrode pad 31, the device is conveniently welded to a circuit board of a lamp panel, and when the lamp panel is broken down in the later period, each LED packaging light source can be disassembled, checked and rewelded, without destroying the LED package structure. The arc-shaped notches 7 are respectively formed in the outer sides of the positive-electrode terminal 2 and the negative-electrode terminal 3, the copper is provided on the side walls of the arc-shaped notches 7, the positive-electrode terminal 2 is electrically conducted with the positive-electrode pad 21 through the copper, and the negative-electrode terminal 3 is electrically conducted with the negative-electrode pad 31 through the copper.

In a further preferred embodiment of the present disclosure, a positive-electrode conductive connection region 22 and a negative-electrode conductive connection region 32 are provided at the top end of the BT plate 1, there is a gap between the negative-electrode conductive connection region 32 and the positive-electrode conductive connection region 22, the LED light-emitting chip 4 is disposed on the negative-electrode conductive connection region 32, the LED light-emitting chip 4 is bonded to the positive-electrode conductive connection region 22 through the leads 5, and the LED light-emitting chip 4 is fixedly packaged with the positive-electrode conductive connection region 22 and the negative-electrode conductive connection region 32 through the package colloid 6.

In this embodiment, the positive-electrode conductive connection region 22 and the negative-electrode conductive connection region 32 are provided at the top end of the BT plate 1, a gap is provided between the negative-electrode conductive connection region 32 and the positive-electrode conductive connection region 22, and the negative-electrode conductive connection region 32 and the positive-electrode conductive connection region 22 can be filled with a copper or aluminum conductive material. The negative-electrode conductive connection region 32 and the positive-electrode conductive connection region 22 are arranged at intervals to avoid short circuit caused by direct connection of the two and ensure normal light-emitting operation of the LED light-emitting chip 4, and the circuit passing area is increased by employing the two to improve the heat dissipation efficiency. By arranging the leads 5, the power line is connected, and a power element is packaged by the package colloid 6 to solve the hidden trouble of electric leakage.

In a further preferred embodiment of the present disclosure, the second GND port 11 of one LED light-emitting chip 4 is directly and electrically connected to the first GND port 8 of the other LED light-emitting chip 4 through a connection lead; the second signal output DO port 12 of one LED light-emitting chip 4 is directly and electrically connected to the first signal input DI port 9 of the other LED light-emitting chip 4 through a connection lead; and the second VDD port 13 of one LED light-emitting chip 4 is directly and electrically connected to the first VDD port 10 of the other LED light-emitting chip 4 through a connection lead.

In this embodiment, the port distribution is regular, the structure and connection are simple.

In a further preferred embodiment of the present disclosure, a controller 14 is provided on a side of each of the plurality of LED package structure bodies, the controller 14 is provided with a negative-electrode output terminal 15 and a signal output terminal 16, the negative-electrode output terminal 15 is directly and electrically connected to the first GND port 8 through a connection lead, and the signal output terminal 16 is directly and electrically connected to the first signal input DI port 9 through a connection lead.

In this embodiment, rapid connection is facilitated, and the manufacturing cost is reduced.

In a further preferred embodiment of the present disclosure, a metal conductive layer 17 is provided on the BT plate 1, a drive control IC 18 is provided on the metal conductive layer 17, and the LED light-emitting chip 4 is electrically connected to the drive control IC 18 and the metal conductive layer 17.

In this embodiment, IC control is facilitated, integrated packaging is achieved, an external control IC is no longer required for connection, the connection is implemented through a self-controlled flash method of the LED light source, and the manufacturing cost is reduced.

The BT plate made of the light-transmissive material and the LED chip packaged on one side of the BT plate allow light of the LED chip to be transmitted through the periphery and top end of the package colloid and the back side of the BT plate, thereby improving the light-emitting dead angle, achieving comprehensive light-emitting, reducing the production cost, improving the device practicability, facilitating regular port distribution, and achieving the structure and connection simplicity. Moreover, LEDs can be directly and quickly connected through connection wires, and the external control IC is not required anymore, thereby implementing the connection through a self-controlled flash method of the LED light source, and reducing the manufacturing cost.

It should be noted that, for the sake of simplicity, the foregoing examples of the method are described as a series of action combinations, but those skilled in the art will recognize that the present disclosure is not limited by the sequence of actions described, certain steps may be carried out in another order or at the same time according to the present disclosure. Secondly, it should be understood by those skilled in the art that the examples described in the specification are preferred examples and the involved actions and modules are not necessarily necessary for the present disclosure.

In several examples provided herein, it should be understood that the disclosed apparatus may be implemented in other manners. For example, the described apparatus embodiments are merely examples. For example, division into the units may be other division in actual implementation. For example, a plurality of units or components may be combined or integrated into another system, or some features may be ignored or not performed. In other respects, the intercoupling or communication connection shown or discussed may be indirect coupling or communication connection through some interfaces, apparatuses, or units, or may be implemented in an electrical or other forms.

The units described as separate parts may be or may not be physically separate, and parts displayed as units may be or may not be physical units, may be located in one position, or may be distributed on a plurality of network units. Some or all of the units may be selected according to actual needs to achieve the objectives of the solutions of embodiments.

The above embodiments are only used for describing the technical solutions of the present disclosure, and are not intended to limit the scope of protection of the present disclosure. Apparently, the described embodiments are merely a part, rather than all of the embodiments of the present disclosure. All other embodiments obtained by those of ordinary skill in the art based on the embodiments of the present disclosure without creative efforts shall fall within the protection scope of the present disclosure. Although the present disclosure has been described in detail with reference to the above embodiments, those of ordinary skill in the art can still combine, add, delete, or make other modifications to the features in the various embodiments of the present disclosure according to circumstances without conflict or creative effort, thereby obtaining other different technical solutions that do not essentially deviate from the concept of the present disclosure. These technical solutions also belong to the scope of protection of the present disclosure.

What is claimed is:

1. An integrated light emitting diode (LED) package structure light source, comprising: a plurality of LED package structure bodies, wherein the plurality of LED package structure bodies each comprise a Bismaleimide Triazine (BT) plate (1), a positive-electrode terminal (2), a negative-electrode terminal (3), LED light-emitting chips (4), a control integrated circuit (IC), and a package colloid (6);

the BT plate (1) is made of a light-transmissive material;

a first GND port (8), a first signal input DI port (9), and a first VDD port (10) are provided on one side of the LED light-emitting chip (4) from top to bottom;

a second GND port (11), a second signal output DO port (12), and a second VDD port (13) are provided on the other side of the LED light-emitting chip (4) from top to bottom; and the first GND port (8) is a negative-electrode input port; the second GND port (11) is a negative-electrode output port; the first VDD port (10) is a positive-electrode input port; the second VDD port (13) is a positive-electrode output port; the second GND port (11) of one LED light-emitting chip (4) corresponds to the first GND port (8) of the other LED light-emitting chip (4); the second signal output DO port (12) of the one LED light-emitting chip (4) corresponds to the first signal input DI port (9) of the other LED light-emitting chip (4); and the second VDD port (13) of the one LED light-emitting chip (4) corresponds to the first VDD port (10) of the other LED light-emitting chip (4).

2. The integrated LED package structure light source according to claim 1, wherein the BT plate (1) is made of glass, fiberglass cloth, a resin adhesive, or a PC material; the BT plate (1) is made by a die injection molding technology of BT board+lead frame+sealant; and the BT plate (1) and the package colloid (6) are completely bonded to form a complete LED package structure.

3. The integrated LED package structure light source according to claim 1, wherein the second GND port (11) of the one LED light-emitting chip (4) is directly and electrically connected to the first GND port (8) of the other LED light-emitting chip (4) through a connection lead; the second signal output DO port (12) of the one LED light-emitting chip (4) is directly and electrically connected to the first signal input DI port (9) of the other LED light-emitting chip (4) through a connection lead; and the second VDD port (13) of the one LED light-emitting chip (4) is directly and electrically connected to the first VDD port (10) of the other LED light-emitting chip (4) through a connection lead.

4. The integrated LED package structure light source according to claim 3, wherein a controller (14) is provided on a side of each of the plurality of LED package structure bodies, the controller (14) is provided with a negative-electrode output terminal (15) and a signal output terminal (16), the negative-electrode output terminal (15) is directly and electrically connected to the first GND port (8) through a connection lead, and the signal output terminal (16) is directly and electrically connected to the first signal input DI port (9) through a connection lead.

5. The integrated LED package structure light source according to claim 4, wherein a metal conductive layer (17) is provided on the BT plate (1), a drive control IC (18) is provided on the metal conductive layer (17), and the LED light-emitting chip (4) is electrically connected to the drive control IC (18) and the metal conductive layer (17).

6. The integrated LED package structure light source according to claim 1, wherein the positive-electrode terminal (2) and the negative-electrode terminal (3) are arranged in pairs and are not in contact with each other; the LED light-emitting chip (4) is electrically connected to the positive-electrode terminal (2) and the negative-electrode terminal (3); and the package colloid (6) is disposed at a top end of the BT plate (1); and the LED light-emitting chip (4) is fixedly packaged inside the package colloid (6).

7. The integrated LED package structure light source according to claim 6, wherein the positive-electrode terminal (2) and the negative-electrode terminal (3) are respectively arranged on two sides of the top end of the BT plate (1), leads (5) are connected to two ends of the LED light-emitting chip (4), the two leads (5) are respectively bonded to the positive-electrode terminal (2) and the negative-electrode terminal (3), and the leads (5) are fixedly packaged inside the package colloid (6).

8. The integrated LED package structure light source according to claim 7, wherein the first GND port (8) is connected to the negative-electrode terminal (3), and the second VDD port (13) is connected to the negative-electrode terminal (3).

9. The integrated LED package structure light source according to claim 6, wherein a positive-electrode pad (21) and a negative-electrode pad (31) are provided at a bottom end of the BT plate (1), the positive-electrode pad (21) is arranged opposite to the positive-electrode terminal (2), the positive-electrode pad (21) is electrically conducted with the positive-electrode terminal (2), the negative-electrode pad (31) is arranged opposite to the negative-electrode terminal (3), the negative-electrode pad (31) is electrically conducted with the negative-electrode terminal (3), arc-shaped notches (7) are respectively formed in outer sides of the positive-electrode terminal (2) and the negative-electrode terminal (3), copper is provided on side walls of the arc-shaped notches (7), the positive-electrode terminal (2) is electrically conducted with the positive-electrode pad (21) through the copper, and the negative-electrode terminal (3) is electrically conducted with the negative-electrode pad (31) through the copper.

10. The integrated LED package structure light source according to claim 9, wherein a positive-electrode conductive connection region (22) and a negative-electrode conductive connection region (32) are provided at the top end of the BT plate (1), there is a gap between the negative-electrode conductive connection region (32) and the positive-electrode conductive connection region (22), the LED light-emitting chip (4) is disposed on the negative-electrode conductive connection region (32), the LED light-emitting chip (4) is bonded to the positive-electrode conductive connection region (22) through the leads (5), and the LED light-emitting chip (4) is fixedly packaged with the positive-electrode conductive connection region (22) and the negative-electrode conductive connection region (32) through the package colloid (6).

\* \* \* \* \*